(12) United States Patent
Scheirer et al.

(10) Patent No.: US 9,578,436 B2
(45) Date of Patent: Feb. 21, 2017

(54) CONTENT-AWARE AUDIO MODES

(71) Applicant: Bose Corporation, Framingham, MA (US)

(72) Inventors: Eric D. Scheirer, West Newton, MA (US); William Berardi, Grafton, MA (US); Mike Arthur Derrenberger, Marlborough, MA (US); Clark Don Woolstenhulme, Framingham, MA (US)

(73) Assignee: Bose Corporation, Framingham, MA (US)

( * ) Notice: Subject to any disclaimer, the term of this patent is extended or adjusted under 35 U.S.C. 154(b) by 123 days.

(21) Appl. No.: 14/184,989

(22) Filed: Feb. 20, 2014

(65) Prior Publication Data

US 2015/0237454 A1     Aug. 20, 2015

(51) Int. Cl.

| | | |
|---|---|---|
| *H03G 3/00* | (2006.01) | |
| *H04S 5/00* | (2006.01) | |
| *H03G 5/16* | (2006.01) | |
| *H03G 7/00* | (2006.01) | |
| *H03G 3/32* | (2006.01) | |
| *H04S 7/00* | (2006.01) | |

(52) U.S. Cl.
CPC .......... *H04S 5/00* (2013.01); *H03G 5/165* (2013.01); *H03G 3/005* (2013.01); *H03G 3/32* (2013.01); *H03G 7/007* (2013.01); *H04S 7/00* (2013.01); *H04S 2400/01* (2013.01)

(58) Field of Classification Search
CPC .......... H04S 5/00; H04S 7/00; H04S 7/305; H04S 2400/01; H03G 5/165; H03G 3/3089; H03G 3/3005; H03G 3/32; H03G 7/007; H04N 5/60; H04N 21/4394
See application file for complete search history.

(56) References Cited

U.S. PATENT DOCUMENTS

| | | |
|---|---|---|
| 7,974,422 B1 | 7/2011 | Ho et al. |
| 2004/0044525 A1 | 3/2004 | Vinton et al. |
| 2007/0083904 A1 | 4/2007 | Lo |
| 2008/0016532 A1 | 1/2008 | Wang et al. |
| 2009/0304205 A1 | 12/2009 | Hardacker et al. |

(Continued)

FOREIGN PATENT DOCUMENTS

| | | |
|---|---|---|
| CA | 2849062 A1 | 5/2013 |
| EP | 2252083 A1 | 11/2010 |

(Continued)

OTHER PUBLICATIONS

Invitation to Pay Additonal Fees dated Jun. 15, 2015 for International application No. PCT/US2015/016125.

(Continued)

*Primary Examiner* — Andrew L Sniezek

(57) ABSTRACT

An audio system for manipulating audio material for playback based on the content of the material includes an input for receiving input audio signals, an output for providing output audio signals to loudspeakers, and an audio processor that processes the input audio signals to produce the output audio signals. The audio processor determines a type of content represented by the input audio signals, selects a set of processing instructions to control the spatial presentation of the audio material based on the determined type, and applies the selected set of processing instructions to the input audio signals.

21 Claims, 4 Drawing Sheets

(56) References Cited

U.S. PATENT DOCUMENTS

2012/0005701 A1     1/2012   Quan
2014/0133683 A1*   5/2014   Robinson et al. ............ 381/303

FOREIGN PATENT DOCUMENTS

WO     2013006330 A2    1/2013
WO     2013006338 A2    1/2013
WO     2014160542 A2    10/2014

OTHER PUBLICATIONS

International Search Report and Written Opinion dated Aug. 21, 2015 for International application No. PCT/US2015/016125.

\* cited by examiner

| Time | Content Type | Processing |
|---|---|---|
| 10:00 | dialog | emphasize center |
| 10:20 | action | full surround |
| 10:25 | commercial | lower volume |
| 10:30 | action | full surround |
| 10:40 | dialog | emphasize center |
| 10:55 | commercial | lower volume |
| 11:00 | news in stereo | synthesize center |
| 11:25 | commercial | lower volume |
| 11:30 | music video | emphasize L and R |

Fig. 2

| Time | Content Type | Processing |
|---|---|---|
| 10:00 | speech band in Center | emphasize center |
| 10:20 | broadband all channels | full surround |
| 10:25 | small dynamic range | lower volume |
| 10:30 | broadband all channels | full surround |
| 10:40 | broadband all channels | full surround |
| 10:55 | small dynamic range | lower volume |
| 11:00 | correlated speech band in L and R | synthesize center |
| 11:25 | small dynamic range | lower volume |
| 11:30 | broadband L and R | emphasize L and R |

Fig. 3

CONTENT-AWARE AUDIO MODES

BACKGROUND

This disclosure relates to an audio playback system that modifies the presentation of audio based on knowledge of the content.

Home theater systems are generally capable of manipulating the audio portion of entertainment content in a variety of ways. Two of the most common aspects of the audio for a system to modify are the equalization and the spaciousness of the content. Different types of content may benefit from different types of processing. For example, it may be desirable for musical content to be distributed to left and right main speakers, according to the original stereo mix of the recording, while the audio track of a news broadcast, which is mainly human voice, should be mostly played back from a center speaker. Problems may arise when more than one type of content are combined. For example, a person speaking while background music plays, or a television program that switches from one type of content to another. Depending on how the audio content is mastered, it may not be practical to separate the speech, for delivery via the center speaker, from the music, for delivery from left and right speakers, let alone to determine the correct relative volume for the two parts.

SUMMARY

In general, in one aspect, an audio system for manipulating audio material for playback based on the content of the material includes an input for receiving input audio signals, an output for providing output audio signals to loudspeakers, and an audio processor that processes the input audio signals to produce the output audio signals. The audio processor determines a type of content represented by the input audio signals, selects a set of processing instructions to control the spatial presentation of the audio material based on the determined type, and applies the selected set of processing instructions to the input audio signals.

Implementations may include one or more of the following, in any combination. Determining the type of content includes determining the identity of an audio program of which the input audio signals are part. Determining the identity of the audio program includes accessing metadata accompanying the input audio signals, the metadata identifying the audio program. Determining the type of content includes comparing the identification of the audio program from the metadata with an analysis of the input audio signals to confirm the identification. Determining the identity of the audio program includes computing a digital signature from the input audio signals, and looking up the identity of the audio program based on the digital signature. Selecting the set of processing instructions includes downloading a set of processing instructions based on the identity of the audio programming determining the type of the audio program includes accessing metadata accompanying the input audio signals, the metadata indicating the type the audio program.

The metadata includes closed-captioning signals, and determining the type of the audio program further includes continuously updating the type determination based on indications of audio type within the closed-captioning signals. The metadata accompanying the input audio signals includes metadata from more than one aspect of the input audio signals. The metadata includes two or more of closed-captioning signals, data included in an HDMI signal identifying the type or title of the program, program guide data, and data embedded in a side-channel of the input audio signal. Determining the type of content includes analyzing the input audio signals to determine the relative spectral content of the input audio signals, and inferring the type of content based on the analysis. The analysis includes identifying voice-band components within the input audio signals. The analysis includes identifying music components within the input audio signals. The analysis includes determining that voice and non-voice noises may be both present in a single channel of the input audio signals. The type may be determined by analyzing the input audio signals when data directly identifying the type or identity of the input audio signals may be not available.

Selecting the set of processing instructions includes selecting a stored set of processing instructions corresponding to the type of program identified. Selecting the set of processing instructions includes selecting individual processing instructions for each of the input audio signals. The set of processing instructions apply different equalization to different input signals. Selecting the set of processing instructions includes selecting a different set of processing instructions for each episode of episodic material. Determining the type of content includes identifying the source of the content, and selecting the set of processing instructions includes selecting a different set of processing instructions for each source of content. Selecting the set of processing instructions includes selecting processing instructions consistent with a user preference. The audio system includes a process for performing a calibration, and the user preference is obtained during the calibration process. The user preference is based on a user input to a control feature associated with dialog level.

Applying the set of processing instructions extracts a voice component from left and right channels of the input audio signals and outputs the voice component on a center channel of the output audio signals. Applying the set of processing instructions decreases the presence of musical content within the input audio signals when voice content may be also present within the input audio signals. Applying the set of processing instructions decreases low-frequency signal energy within the output audio signals relative to the input audio signals. Applying the set of processing instructions decreases the output level of a first set of sounds within the input audio signals relative to a second set of sounds within the input audio signals. Determining the type of content further includes determining a time-sequence of types of processing to be applied to the input audio signals over the course of the identified audio program, and applying the set of processing instructions includes applying different processing instructions to the audio signals over time in synchronization with the changes to type of content. The time-sequence of types of processing corresponds to a program schedule. The time-sequence of types of processing corresponds to a sequence of scenes in a single program. Applying the set of processing instructions causes the audio to be output over fewer output channels than may be present in the input audio signals for a first type of content, and causes the audio to be output over the same number of output channels as may be present in the input audio signals for a second type of content. Loudspeakers for receiving the output audio signals, wherein: the loudspeakers include more than one type of loudspeaker, each type of loudspeaker having different radiation patterns, and the processing instructions cause different portions of the input audio signals to be distributed to different ones of the loudspeakers based on the type of audio content and the radiation patterns of the loudspeakers. The set of processing instructions further control the spectral presentation of the audio material. The processing instructions maintain intelligibility of speech within the audio program while adjusting the overall volume of the program. The processing instructions raise and lower the volume of speech sounds at a different rate than they raise and lower the volume of non-speech sounds in response to a total volume level being raised and lowered, respectively.

Advantages include automatically adjusting the presentation of audio material based on its content, to compensate for mis-matches between the recorded audio and the playback system, for example by preserving dialog intelligibility and improving spatial presentation.

All examples and features mentioned above can be combined in any technically possible way. Other features and advantages will be apparent from the description and the claims.

BRIEF DESCRIPTION OF THE DRAWINGS

FIGS. 2 and 3 show tables of audio processing types.

DESCRIPTION

Figure 1:
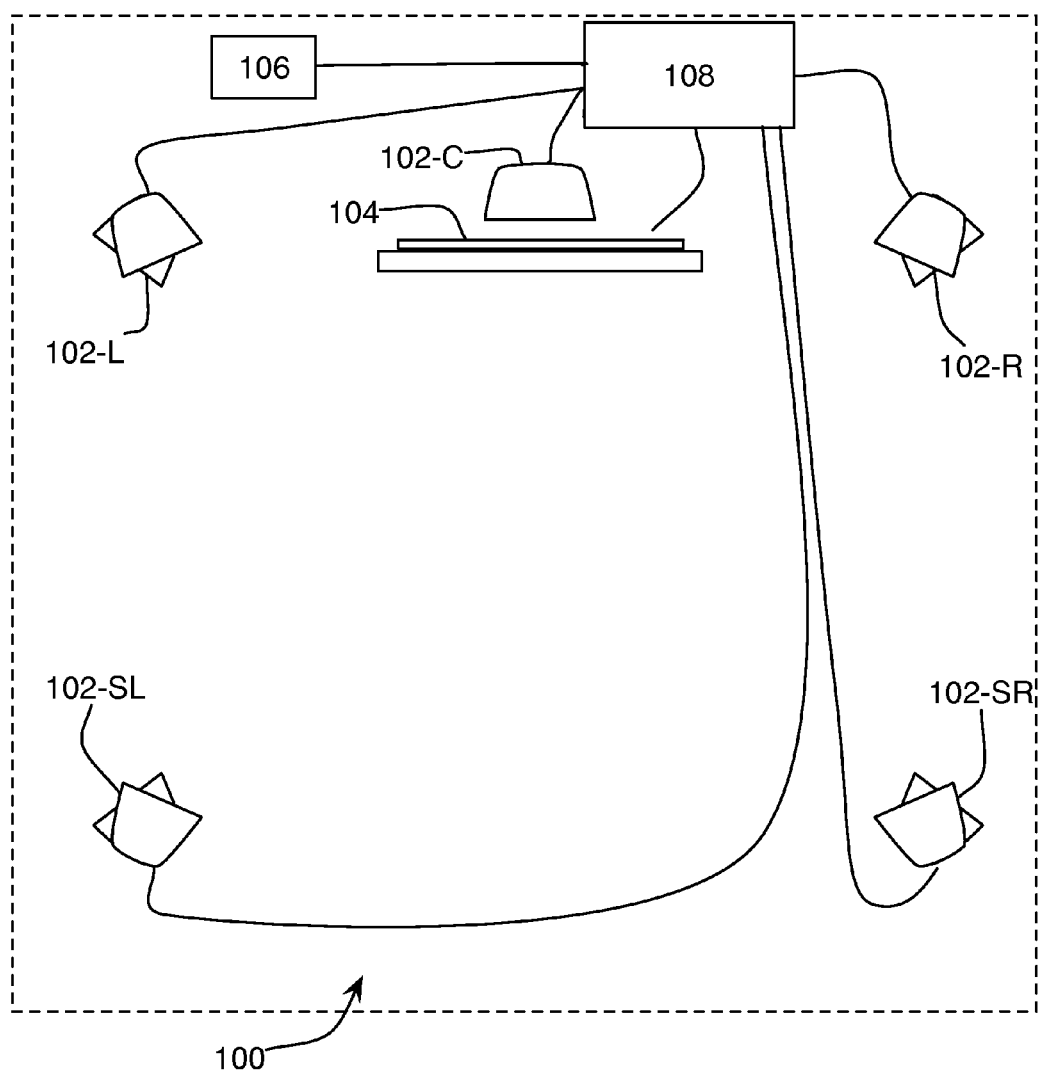
FIG. 1 shows the layout of a typical home theater audio-visual system.

As shown in FIG. 1, the audio system 100 considered by this disclosure has a number of speakers 102-X, where X indicates nominal position, distributed around a listening space. A typical configuration has five speakers: left (102-L), right (102-R), center (102-C), left surround (102-SL), and right surround (102-SR). The speakers are oriented around a video screen 104. Other systems may include more or fewer speakers. More speakers are usually used to provide additional locations for surround speakers, such as rear and side, or higher on the wall to provide a vertical element to sound effects. Fewer speakers are used if the user does not want to position rear speakers, or is primarily concerned with music, rather than surround-sound and special effects. Combined speaker arrays, such as sound bars, that provide similar effects from a single enclosure housing multiple speakers are increasingly popular and also benefit from the techniques described below. In addition to fixed-location loudspeakers, additional speakers, such as headphones or portable personal speakers may be integrated into the system 100.

One or more audio-visual source devices 106, such as a cable box or streaming media device provides visual content to the video screen 104 and audio content for the speakers 102 through an A/V processor 108. The A/V processor 108 may be a discrete audio processing device, optionally with an integrated amplifier, commonly called a "receiver," "tuner," or "amp" or it may provide additional functions, such as switching video sources and receiving terrestrial radio broadcasts. Alternatively, the processor may be integrated into the video screen, one or more of the loudspeakers, or a source device. In many cases, the video screen also serves as a source device, decoding video content for itself and providing the audio content to the processing device. The source device(s), processing device, video screen, and speakers are all interconnected, using wired or wireless connections, or a combination of interconnect technologies. One or more of the source devices and processing device is also generally connected to a network, again wired or wirelessly.

Different types of audio-only and audio/visual content are prepared differently based on the sound systems on which they are expected to be delivered, the content within them, and the preferences of the person supervising the production process. The process by which original audio content is prepared and committed to a recording for distribution is called "mastering." Examples of different mastering types include the following. For typical musical recordings, a simple stereo mix may be provided, with a "phantom" center, where the voice of a singer is provided in both channels, so that when played back over a stereo pair of speakers, the listener will perceive the voice as coming from a point between the speakers. In a multi-channel musical recording, where the music is to be distributed within a high definition television signal or on a DVD, for example, the voice may instead be put in a discrete center channel. Music videos present another situation, in which both the music and singing are associated with visual elements, and the use of multiple channels may be based on that association, or otherwise used for artistic effect.

Non-musical sources are generally mastered differently. Modern high definition television is generally distributed in a multi-channel, surround-sound format. Talk-centric television, such as a news broadcast, typically locates the voices in the center channel. Other sounds, such as street noise, are located in the front left and right channels, and studio audience responses, if present, are located in the surround channels. In other situations, such as a field reporter broadcasting from a news scene using a single camera and microphone, the voice and background sounds may be combined within a single original channel, which may be provided to the center channel or distributed to the left and right channels. Dramatic television and movies, on the other hand, will again have the voices in the center channel, unless a spatial location effect is intended, but will also include sound effects and background music in all channels. Although it is sometimes suggested that the surround speakers are for sound effects, if the event associated with the sound, such as an explosion, is on screen, the sound should be delivered through the center or front channels.

When the number of channels provided in a program does not match the number of speakers in a given playback system, decisions have to be made within the playback system about how to distribute the audio content. In the common situation of five-channel content and a two-channel playback system, surround channels may be combined into the corresponding front channels, and the center channel distributed to both front channels. Conversely, up-mixing algorithms are sometimes used to attempt to distribute two-channel content over a five-channel playback system. Even when the number of channels matches the number of speakers, the speakers may not be positioned where the audio engineer assumed they would be, or they may not all have the appropriate bandwidth or other response properties for the audio content allocated to them by the mastering.

In all of these situations, two principle problems are the overlapping of sounds, within a given channel, that are meant to be perceived separately, and a mis-match between the output capabilities of the playback system and the expectation of the person mastering the recording. Overlapping sounds can cause masking, such as where the listener can't hear the dialog over the sound track or special effects. Audio that was understandable over a movie theater sound system may be unintelligible when watched on TV. Even audio meant for TV may come out wrong, where the audio system is not what the producers assumed. Ideally, the raw audio could be provided to the playback system, and the system could arrange and adjust the sound for playback as appropriate to the actual system performance. This disclosure explains several techniques that can be used to adjust the playback of pre-recorded audio to regain some of the desired sound stage definition and spectral balance. A critical part do doing this is to identify what it is that is being played back, so that appropriate processing can be applied. We first discuss what techniques can be used to identify the content, and then discuss what may be done with it, which depends in part on the specificity of the identification.

As noted above, in the ideal situation, audio would be delivered with fully separate channels for each element (voice, music, background sounds, etc.), and with complete information about how it is meant to be heard. Two alternative steps back from that ideal are to identify what the content is, so that the intended playback can be looked up, and to identify what type of audio the content contains, so that inferences may be drawn about how it should be played back. For identifying the content itself, several options may be available. For a digital television transmission over cable or satellite, program information is generally provided by the distributor, though the completeness of this information is often lacking, especially for repeats of older programming or for live programming. For broadcast programming, or for cable and satellite programming lacking reliable program guide information, the identity of the program may be looked up based on the channel and time. For other sources, such as internet streaming of television and movie programming, the amount of program description provided varies between the different services, but generally at least includes enough to look up the program. In each of these, it is assumed that the transmission includes at least enough information to identify the program, and that additional information may be found elsewhere, such as in an on-line database, identifying what audio the program contains, and how it should be played back.

It is often the case, however, that even if program information was available at some point, it is not provided to the audio system. For example, if HDMI cabling is used to deliver audio and video from a cable box to a home theater audio system, the HDMI signal does not contain the program guide information identifying what is being shown. CEC data channels may provide some metadata, but this feature is not always implemented in source devices. Other formats, such as digital audio and analog signals, contain even less metadata. For this reason, it is advantageous to be able to identify the program based only on the content, and ideally based only on the audio content. This can be done using a technique called "fingerprinting," in which the audio content is processed by an algorithm that outputs a digital signature unique to that audio recording. A database of such signatures, based on a large library of recordings, is then used to look up the identity of the recording. Multiple techniques for doing this are known in the art, and their details are not included here. These are of course examples only, not a complete listing of ways to identify content.

Once the content is identified, a second database is consulted to determine what to do with it. Such a database may include detailed instructions, such as a scene-by-scene or minute-by-minute listing of how the content should be rendered, as shown in FIG. 2. Simpler instructions may have similar guidance on a larger time scale, such as a set of audio processing parameters for a single episode or movie, or for an entire series of programming or an entire channel or genre. The instructions may also be of varied specificity. Detailed instructions may include content assignment, equalization, and level setting instructions for each of multiple channels, while simple instructions may simply be to optimize for music or voice. The more granular the identifications and instructions, the better the ultimate experience is expected to be, but data resources and availability will generally require compromises.

Looking up information, whether to identify the content or to find out what to do with it, assumes that the audio system has access to a network. If a large local database could be provided, it would need frequent updates, but in some examples a periodically-updated database may be used to provide a local cache of information about upcoming programming, allowing off-line operation. The selection of what information to cache may be based on local or global watching habits. If a network is not available and local information is incomplete, how to process the audio can be determined by examining the audio content directly. The audio system can examine the audio signals do determine such factors as whether speech or music is present, and in which channels, and whether low-frequency sounds have been mixed into full-range channels. For example, if most of the energy in the center channel is within the human speech band, and energy in other channels is more distributed, this would indicate that the center channel is dialog, and the other channels are music or background sounds. If speech-band energy is found in both left and right channels, and the signal within that band is the same (correlated) in both channels, this would tend to indicate a phantom center channel was used.

Another indication of content type in the audio signals is the dynamic range of the audio content. Dynamic range, that is, the difference between the quietest part and the loudest part of the signal, tends to be different for different types of programming. Most useful, perhaps, is the fact that commercials tend to have a very small dynamic range—the entire commercial is loud. It is uncommon for any other type of content to have such a small dynamic range—even action scenes in movies will have a large dynamic range, so that loud events have something to sound loud relative to. Additional metadata, other than identifying information, may be added to a broadcast to provide specific cues about how to present the audio. In particular, closed-captioning, when available, may provide detailed information about what the audio content is and how it relates to what is on screen. In addition to simply interpreting the presence of captions as indicating that dialog is taking place, captions also indicate when music is playing, by displaying musical note symbols, and they may describe sound effects by enclosing the descriptions in brackets. When the lyrics of a song have been captioned, they may be bracketed by the music note symbol. All of this information can be used as additional input about what is really on screen and in the audio content at a given time. More generally, multiple sources of information may be available, and the system described here can take advantage of as much information as it can get, from as many sources as it can access, to make the best decisions possible about how to present the audio content.

Once the audio content is identified or characterized, it can be processed in various ways to improve delivery. For content identified as music, music up-mixing algorithms can be used to separate individual instruments or voices (assuming they are recorded and mastered in a way that allows localization), and the sound processor can then deliver the up-mixed audio uniformly to all the speakers so that the combined effect of all the speakers provides a generally enveloping experience with localizable sounds. If voice is present, that can be isolated to appropriate speakers. Music tends to have a less-present center, with more diffuse, but it also tends to have a phantom center in the stereo mix. Phantom center can cause problems with some audio systems, such as those using arrays to manage spaciousness. Center extraction (a sub-set of up-mixing) can identify and extract that phantom center, which can then be delivered to the real center speakers.

For content identified as news or other talk-heavy content, the total presentation can be flattened, with dialog provided to the front speakers, and background noises lowered in level and provided to other speakers, if they are available. In content known or expected to have both voice and special effects, the special effects may be moved out of the center channel and de-emphasized when voice is present, or the voice may be boosted to maintain intelligibility over the sound effects. Similarly, background or soundtrack music may be reduced, so that dialog can be heard over it, but emphasized during a dramatic scene, where the dialog is absent. Action scenes in movies or television are most impactful when the audio is low and loud, but both of those factors tend to degrade the ease with which the user can follow the dialog and other detailed sounds. Knowing that such a scene is taking place allows the system to make the sound effects and music low and loud, while keeping the dialog at a level that can still be understood without effort.

Other problems can also be addressed, depending on the amount and quality of data about the content. A frequent complaint of people who watch movies on home theater systems, whether those movies are broadcast, streamed, or from disc, is that the mastering is not appropriate to the format. Most commonly, the problem is that sound effects or background music mask the dialog, reducing intelligibility and listening ease. Similarly, if a user chooses to listen to music over a video-focused home theater system, the default handling of the audio may not be appropriate for music. Although level differences between adjacent television broadcasts can be addressed with automatic volume control, the problem of loudness changes coming from different mastering decisions in the source material is more difficult. All of these problems can be addressed when the content is identified, and the better the identification, the more successfully they can be addressed.

The system can also respond to volume changes by the user or within the program to maintain dialog intelligibility. Similarly to how some systems raise the level of bass frequencies at a different rate than high frequencies, to maintain overall perceived spectral balance as volume is changed, level-dependent processing can maintain dialog intelligibility by managing the level of voice band signals relative to other signals so that intelligibility is maintained at all volume levels. Such techniques can be used independently of the content, but knowledge of content will improve the accuracy of such processing.

As noted above, how much can be done, and how much it can vary over the course of a program will depend on how much is known about the content. If the audio system can identify the content, then it can select what to do at whatever granularity the identification and the audio mastering allows. If the audio system is processing the audio content itself to determine what to do, the amount of manipulation may depend on how much processing power is available. If the analysis can be done continuously and in real-time as the audio is received, then the manipulation can also vary continuously. On the other hand, it may be feasible to only analyze the audio occasionally, such as when the format changes or a significant change in energy levels occurs, indicating a commercial, channel change, or scene change, among other things.

FIGS. 2 and 3 show two possible types of processing. In both figures, a timeline moves down the page, with a time index in the left column, and the processing applied at that time in the right column. The center column indicates what is known about the content. In FIG. 2, the center column represents metadata identifying what is in the programming—dialog, action, commercials, news, or music video. It also notes that the news is in stereo. This data, as explained above, may come from any or multiple sources. The accuracy and detail of the processing will depend on the quality of the data, and combining multiple sources may improve the processing both by providing more data, and allowing data from one source to correct or refine the data from another source. Starting at the top, it is seen that at 10:00, dialog is present, so the processing emphasizes the center channel. If a discrete "dialog" channel were available, this would be used. Next, at 10:20, an action scene begins, and full surround sound is enabled. This is followed by a commercial at 10:25, so the volume is lowered. The action resumes and the surround sound is re-enabled at 10:30, followed by more dialog at 10:40 and a commercial at 10:55, with corresponding processing. At 11:00 the news comes on, in stereo, so a center channel is synthesized. After the 11:25 commercial, a music video comes on, so the left and right channels are emphasized.

In FIG. 3, the center column represents descriptions of the content that the system infers form analyzing the input audio signals. The same programming as in FIG. 2 is used, but in some cases, the inferences about the content will differ from the metadata, so the processing is different. At 10:00, when FIG. 2 indicated there was dialog, the system sees a strong speech band single in the center channel, so it assumes dialog and emphasizes that center channel. At 10:20, the action scene has broadband signal in all channels, so the system enables full surround sound. The commercial has a small dynamic range (i.e., it's loud the entire time, lacking the dips in volume typical of normal content), so it can be detected and the volume lowered. From 10:30 to 10:55, however, the all channels have broadband signal, so the system misses the dialog at 10:40 and dosen't switch from surround sound to center-emphasis. This could be because the metadata from FIG. 2 was wrong, or because the dialog was buried in the background noise of the program. The stereo news broadcast at 11:00 has correlated speech-band signals in left and right, so the system uses this to synthesize the centern channel. The music video at 11:30 has broadband in left and right, so the system emphasizes these channels.

Given enough data about content, a large number of adjustments are ultimately possible. When the upcoming content is known in advance, the total power projected at the audience can be proactive managed. During quiet passages, power can be reserved, so that a drum solo, lion roar or cannon fire, to name a few examples, will be more impactful when it arrives and the volume and envelopment are increased. As noted above, dialog can be made more clear when there's no background noise. Intelligibility or listening ease can be improved by removing distracting content and changing equalization and spaciousness to emphasize voice and separate it from background sounds. One example of removing content would be to reduce or remove low-frequency signals during a news broadcast. Many audio systems have a greater range of spatial presentation than the audio content makes use of, so the spaciousness of almost any program can be improved. Knowledge of the content allows that do be done in an appropriate manner. Many systems include a "midnight" or "baby sleeping" mode meant to lower dynamic range to avoid disturbing others. These often end up making it difficult to hear detail or follow dialog. Knowing what the content actually is allows a midnight mode to process the audio correctly to lower the peak volume while preserving intelligibility. Given that the system is aware of the time of day (from identifying the content), it can also activate such a midnight mode automatically.

In addition to responding to the information about the content, a system may also learn from its user's reaction to such processing. For example, the system may learn its user's personal genre equalization preferences, as they differ from the pre-programmed equalization based on the actual content spectrum. In an interactive speaker setup routine, such as that described in U.S. Pat. No. 8,150,047, an A/B comparison step may be added, where the user is asked which of two presentations he prefers. This can then be used to learn the user's preferences, which then influences how the system presents the different types of audio programming. The system can also learn from when the user turns off the automatic processing features to tweak how it is applied in the future. Such a system can also give the user a relative volume control for dialog. For example, a remote control may have a "dialog" volume control, separate from the overall volume control, that raises the priority of the dialog versus standard content.

Figure 4:
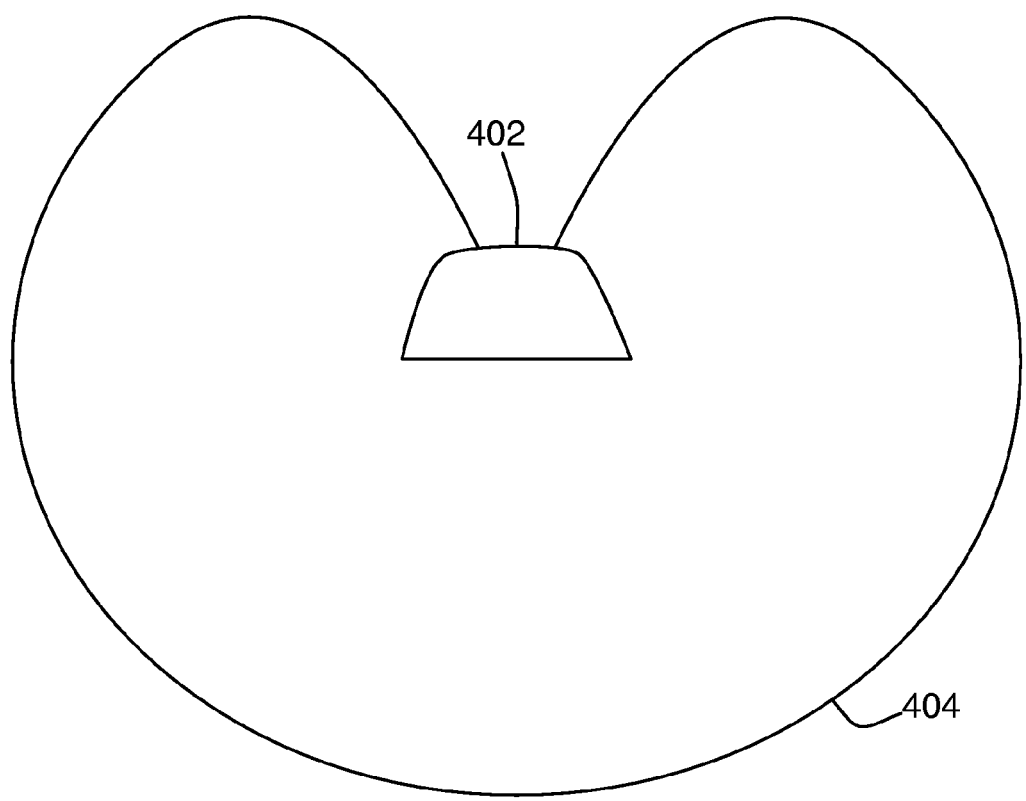
FIGS. 4 and 5 show example loudspeakers with differing radiation patterns.
Figure 5:
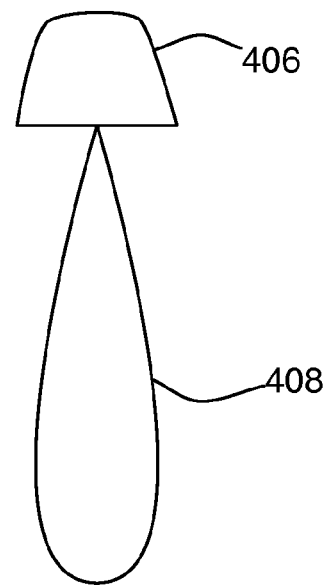

In addition to distributing the sound to different channels and changing the relative level of different channels or different frequency bands, the presentation of audio content may be further customized through the use of multiple speaker types. As shown in FIGS. 4 and 5, different types of speakers have different radiation patterns. The speaker 402 in FIG. 4 has a broad radiation pattern 404, providing sound to a large area surrounding the speaker, making that sound more diffuse and hard to localize. The speaker 406 in FIG. 5 has a narrow radiation pattern 408, providing sound to a small area in front of the speaker, and making that sound easier to localize. In a system equipped with both types of speakers, the audio processing may choose to send different types of audio content to the different speakers. For example, dialog may be sent to a speaker with a narrow radiation pattern, so that it sounds like it is coming from a discrete source (ideally one near where the person speaking is supposed to be), while sound effects or background music may be sent to a speaker with a wide radiation pattern, so that the sound is diffuse and enveloping. With enough data about the content, different sound effects may be sent to different types of speakers. For example, guitar solos in a music video may be sent to a narrow, localizable speaker, while the background roar of the ocean goes to a wide, diffuse speaker. In some cases, loudspeaker arrays are capable of producing different radiation patterns for different signals from a single array, and the audio system may control the signals provided to the array accordingly.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. An audio system for manipulating audio material of an audio program for playback based on the content of the material, the system comprising:
   an input for receiving input audio signals;
   an output for providing output audio signals to loudspeakers; and
   an audio processor that processes the input audio signals to produce the output audio signals, the audio processor configured to:
      determine a type of content represented by the input audio signals;
      select a set of processing instructions to control the spatial presentation of the audio material based on the determined type; and
      apply the selected set of processing instructions to the input audio signals;
   wherein the processing instructions further:
      control the spectral presentation of the audio material;
      maintain intelligibility of speech within the audio program while adjusting the overall volume of the program; and
      raise and lower the volume of speech sounds at a different rate than they raise and lower the volume of non-speech sounds in response to a total volume level being raised and lowered, respectively.

2. The system of claim 1 wherein determining the type of content further comprises analyzing the input audio signals to determine the relative spectral content of the input audio signals, and inferring the type of content based on the analysis.

3. The system of claim 2 wherein the analysis comprises identifying voice-band components within the input audio signals.

4. The system of claim 2 wherein the analysis comprises identifying music components within the input audio signals.

5. The system of claim 2 wherein the analysis comprises determining that voice and non-voice noises are both present in a single channel of the input audio signals.

6. The system of claim 2 wherein the type is determined by analyzing the input audio signals when data directly identifying the type or identity of the input audio signals is not available.

7. The system of claim 1 wherein selecting the set of processing instructions comprises selecting a stored set of processing instructions corresponding to the determined type of content.

8. The system of claim 1 wherein selecting the set of processing instructions comprises selecting individual processing instructions for each of the input audio signals.

9. The system of claim 8 wherein the set of processing instructions apply different equalization to different input signals.

10. The system of claim 1 wherein selecting the set of processing instructions comprises selecting processing instructions consistent with a user preference.

11. The system of claim 10 wherein the audio system includes a process for performing a calibration, and the user preference is obtained during the calibration process.

12. The system of claim 10 wherein the user preference is based on a user input to a control feature associated with dialog level.

13. The system of claim 1 wherein applying the set of processing instructions extracts a voice component from left and right channels of the input audio signals and outputs the voice component on a center channel of the output audio signals.

14. The system of claim 1 wherein applying the set of processing instructions decreases the presence of musical content within the input audio signals when voice content is also present within the input audio signals.

15. The system of claim 1 wherein applying the set of processing instructions decreases the output level of a first set of sounds within the input audio signals relative to a second set of sounds within the input audio signals.

16. The system of claim 1 wherein
determining the type of content further includes determining a time-sequence of types of processing to be applied to the input audio signals over the course of the identified audio program, and
applying the set of processing instructions comprises applying different processing instructions to the audio signals over time in synchronization with the changes to type of content.

17. The system of claim 16 wherein the time-sequence of types of processing corresponds to a program schedule.

18. The system of claim 16 wherein the time-sequence of types of processing corresponds to a sequence of scenes in a single program.

19. The system of claim 1 wherein applying the set of processing instructions causes the audio to be output over fewer output channels than are present in the input audio signals for a first type of content, and causes the audio to be output over the same number of output channels as are present in the input audio signals for a second type of content.

20. The system of claim 1 wherein the set of processing instructions further control the spectral presentation of the audio material.

21. The system of claim 20 wherein the processing instructions maintain intelligibility of speech within the audio program while adjusting the overall volume of the program.

* * * * *